(12) United States Patent
Kudo et al.

(10) Patent No.: US 9,047,889 B1
(45) Date of Patent: Jun. 2, 2015

(54) PERPENDICULAR MAGNETIC RECORDING HEAD HAVING A TRAILING SIDE TAPER ANGLE WHICH IS LESS THAN A LEADING SIDE TAPER ANGLE

(71) Applicant: HGST Netherlands B.V., Amsterdam (NL)

(72) Inventors: Kazue Kudo, Odawara (JP); Hiromi Shiina, Hitachi (JP); Shouji Tokutake, Odawara (JP); Yosuke Urakami, Odawara (JP)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/102,442

(22) Filed: Dec. 10, 2013

(51) Int. Cl.
*G11B 5/39* (2006.01)

(52) U.S. Cl.
CPC .......................... *G11B 5/39* (2013.01)

(58) Field of Classification Search
USPC ....................................................... 360/125.3
See application file for complete search history.

(56) References Cited

U.S. PATENT DOCUMENTS

| | | | |
|---|---|---|---|
| 6,710,973 B2 | 3/2004 | Okada et al. | |
| 7,212,379 B2 * | 5/2007 | Hsu et al. | 360/125.16 |
| 7,889,456 B2 | 2/2011 | Jiang et al. | |
| 7,924,528 B2 | 4/2011 | Sasaki et al. | |
| 8,134,802 B2 * | 3/2012 | Bai et al. | 360/125.3 |
| 8,400,733 B2 * | 3/2013 | Shin et al. | 360/125.15 |
| 8,830,625 B2 * | 9/2014 | Linville et al. | 360/125.3 |
| 8,842,390 B2 * | 9/2014 | Shen et al. | 360/125.3 |
| 2009/0116145 A1 | 5/2009 | Guan et al. | |
| 2009/0296275 A1 | 12/2009 | Sasaki et al. | |
| 2010/0061016 A1 | 3/2010 | Han et al. | |
| 2010/0157474 A1 | 6/2010 | Hsiao et al. | |
| 2010/0157475 A1 | 6/2010 | Hsiao et al. | |
| 2011/0090595 A1 | 4/2011 | Hirata et al. | |
| 2011/0102936 A1 | 5/2011 | Sugiyama et al. | |
| 2011/0134569 A1 | 6/2011 | Allen et al. | |
| 2011/0135959 A1 | 6/2011 | Hong | |
| 2011/0151279 A1 | 6/2011 | Allen et al. | |
| 2013/0242431 A1 * | 9/2013 | Hosomi et al. | 360/119.02 |

FOREIGN PATENT DOCUMENTS

| | | |
|---|---|---|
| JP | 2008300027 | 12/2008 |
| JP | 2010061715 | 3/2010 |
| JP | 2010157298 | 7/2010 |

* cited by examiner

*Primary Examiner* — Wayne Young
*Assistant Examiner* — Mark Blouin
(74) *Attorney, Agent, or Firm* — Zilka-Kotab, PC

(57) ABSTRACT

In one embodiment, a perpendicular magnetic recording head includes a main pole configured to write data to a magnetic medium, a leading-side magnetic shield positioned on a leading side of the main pole in a down-track direction adjacent a media-facing surface of the head, and a trailing-side magnetic shield positioned on a trailing side of the main pole in the down-track direction adjacent the media-facing surface of the head, wherein a trailing side taper is provided on the trailing side of the main pole in the down-track direction, wherein a leading shield taper is provided on a main pole side of the leading-side magnetic shield, and wherein an angle of the trailing side taper relative to a line extending along an element height direction is less than or equal to an angle of the leading shield taper relative to the line extending along the element height direction.

20 Claims, 10 Drawing Sheets

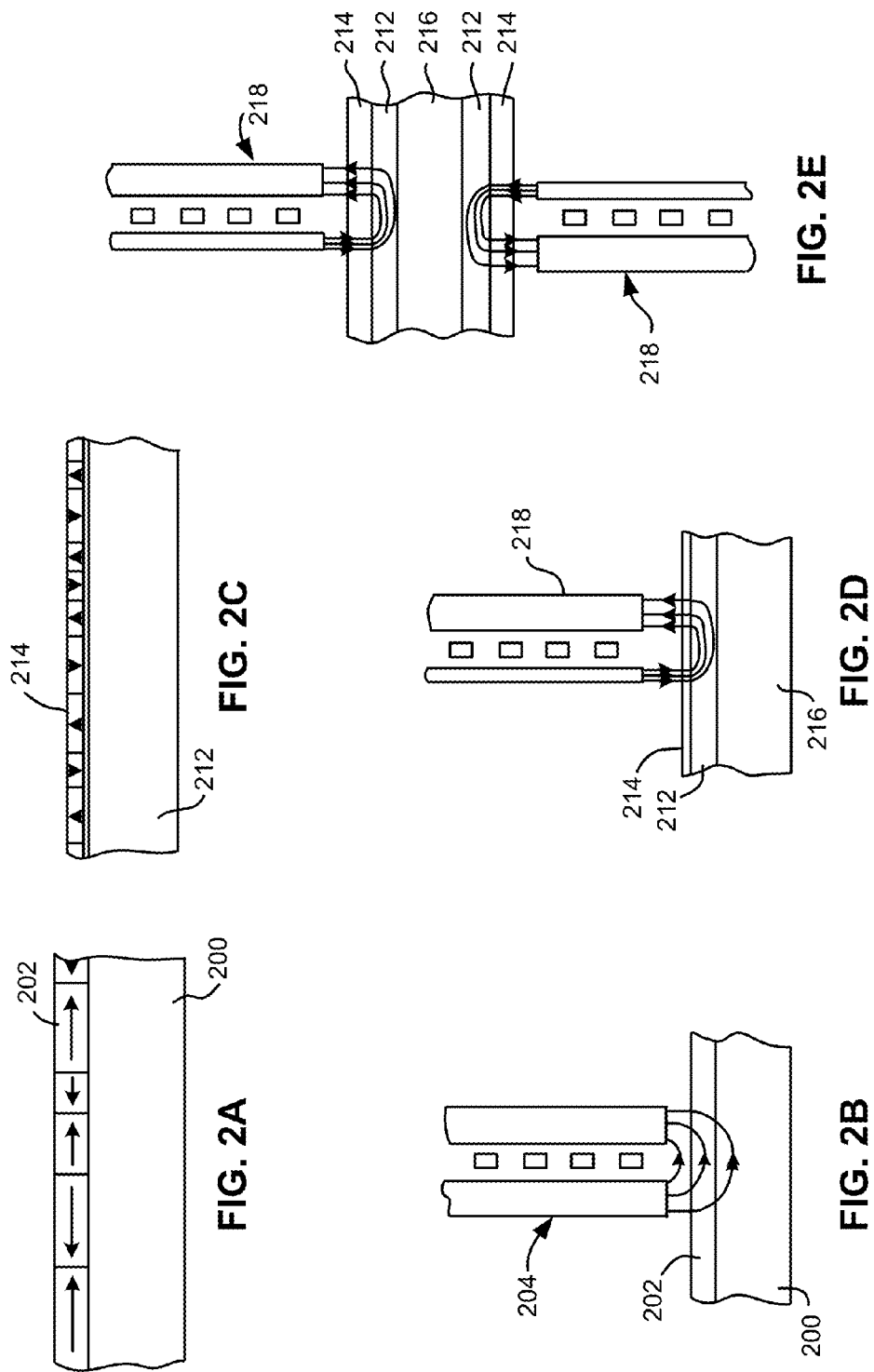

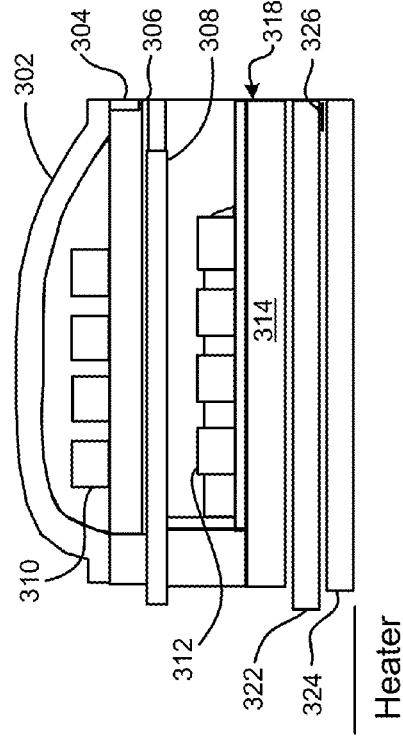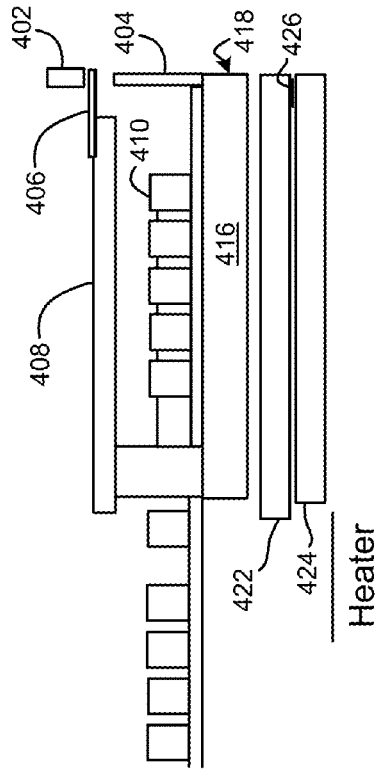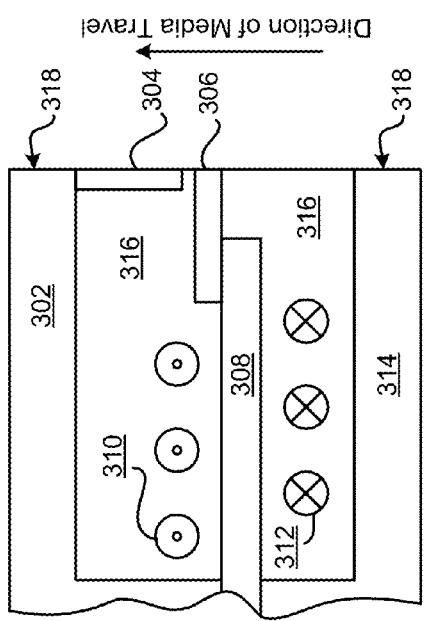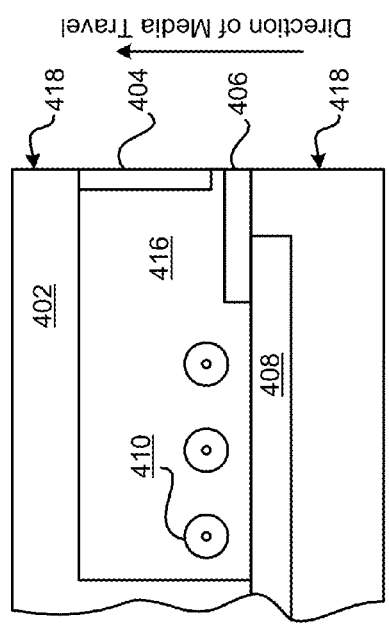

PERPENDICULAR MAGNETIC RECORDING HEAD HAVING A TRAILING SIDE TAPER ANGLE WHICH IS LESS THAN A LEADING SIDE TAPER ANGLE

FIELD OF THE INVENTION

The present invention relates to perpendicular magnetic recording heads, and more particularly, this invention relates to a perpendicular magnetic recording head having a structure with a trailing side taper angle which is less than a leading side taper angle.

BACKGROUND

The heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

The volume of information processing in the information age is increasing rapidly. In particular, HDDs have been desired to store more information in its limited area and volume. A technical approach to this desire is to increase the capacity by increasing the recording density of the HDD. To achieve higher recording density, further miniaturization of recording bits is effective, which in turn typically requires the design of smaller and smaller components.

High recording performance, high reliability, and low manufacturing cost are extremely useful attributes for magnetic recording heads used in HDDs. Japanese Unexamined Patent Application Publication No. 2008-300027 discloses a perpendicular magnetic recording head that is able to provide these attributes. The perpendicular magnetic recording head, according to this publication, includes at least a main pole, a lower shield positioned below the main pole, and side shields positioned on sides thereof.

Recording reliability is obtained due to the shields being disposed below and to the sides of the main pole which prevent erroneous reading of adjacent or nearby tracks, such as erroneous reading due to adjacent track interference (ATI), far track interference (FTI), etc. High reliability is realized by increasing the laminate of the magnetic body of the main pole.

It is well known that to produce magnetic heads at a low cost depends greatly on the manufacturing method utilized. Low manufacturing costs may be accomplished by embedding the main pole in a groove produced via an etching process performed on an upper surface of the lower shield. In order to perform this etching process, U.S. Patent Application Publication Nos. 2011/0151279 and 2011/0134569 disclose a structure in which a taper is provided on a trailing side and a leading side of the main pole in a down-track direction.

However, even with this structure, there is concern that erroneous reading of an adjacent track or nearby tracks due to ATI or FTI may occur. Accordingly, a magnetic head which alleviates these concerns would be very beneficial.

SUMMARY

In one embodiment, a perpendicular magnetic recording head includes a main pole configured to write data to a magnetic medium, a leading-side magnetic shield positioned on a leading side of the main pole in a down-track direction adjacent a media-facing surface of the perpendicular magnetic recording head, and a trailing-side magnetic shield positioned on a trailing side of the main pole in the down-track direction adjacent the media-facing surface of the perpendicular magnetic recording head, wherein a trailing side taper is provided on the trailing side of the main pole in the down-track direction, wherein a leading shield taper is provided on a main pole side of the leading-side magnetic shield, and wherein an angle of the trailing side taper relative to a line extending along an element height direction is less than or equal to an angle of the leading shield taper relative to the line extending along the element height direction.

In another embodiment, a method for forming a perpendicular magnetic recording head includes forming a leading-side magnetic shield, forming a leading shield taper on an upper side of the leading-side magnetic shield, forming a main pole above the leading-side magnetic shield, wherein the leading-side magnetic shield is positioned above a leading side of the main pole in a down-track direction adjacent a media-facing surface of the perpendicular magnetic recording head, forming a trailing side taper on a trailing side of the main pole in the down-track direction, and forming a trailing-side magnetic shield above a trailing side of the main pole in the down-track direction adjacent the media-facing surface of the perpendicular magnetic recording head, wherein an angle of the trailing side taper relative to a line extending along an element height direction is less than or equal to an angle of the leading shield taper relative to the line extending along the element height direction.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

FIG. 3A is a cross-sectional view of one particular embodiment of a perpendicular magnetic head with helical coils.

FIG. 3B is a cross-sectional view of one particular embodiment of a piggyback magnetic head with helical coils.

FIG. 4A is a cross-sectional view of one particular embodiment of a perpendicular magnetic head with looped coils.

FIG. 4B is a cross-sectional view of one particular embodiment of a piggyback magnetic head with looped coils.

DETAILED DESCRIPTION

Figure 1:
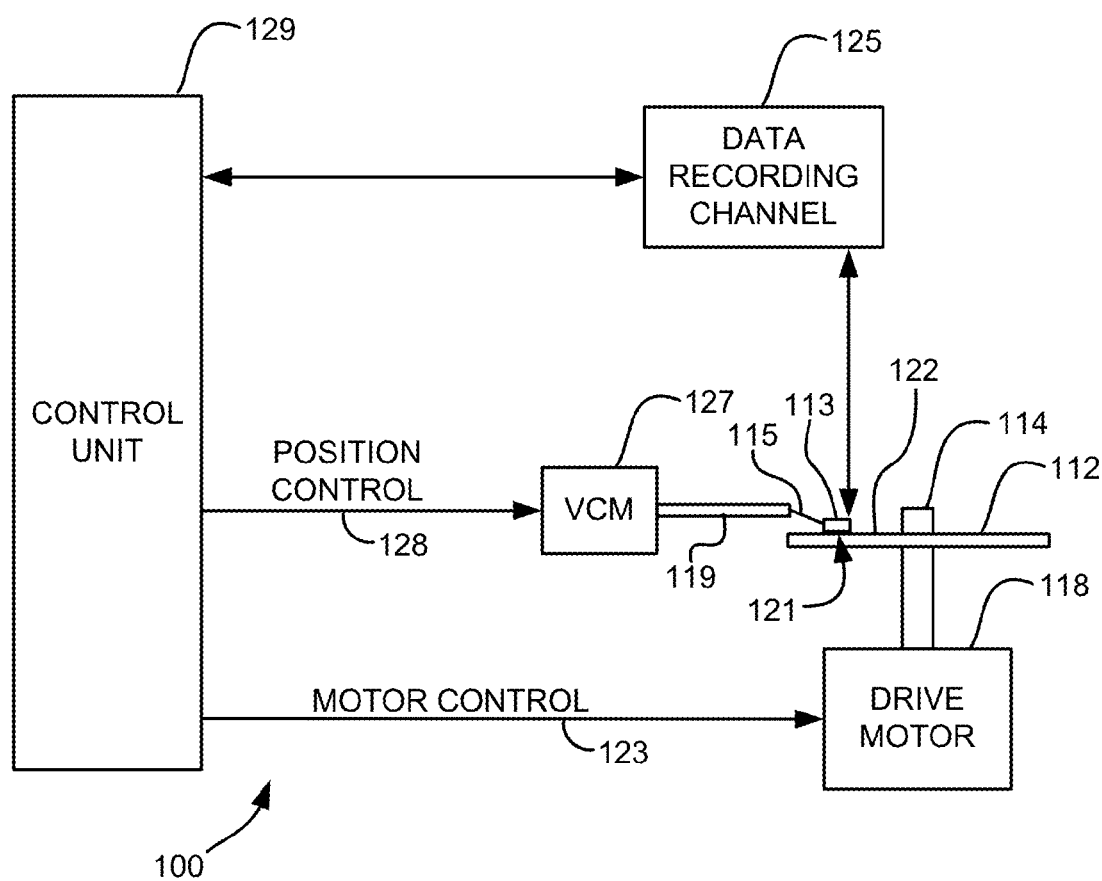
FIG. 1 is a simplified drawing of a magnetic recording disk drive system.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

Due to the concerns over adjacent track and nearby track erroneous reading occurring due to adjacent track interference (ATI) and/or far track interference (FTI) in conventional magnetic heads which utilize a structure which includes a taper on a trailing side and a leading side in a down-track direction of a main pole, a perpendicular magnetic recording head as described according to various embodiments herein, alleviate the adjacent track and nearby track erroneous reading.

In one general embodiment, a perpendicular magnetic recording head includes a main pole configured to write data to a magnetic medium, a leading-side magnetic shield positioned on a leading side of the main pole in a down-track direction adjacent a media-facing surface of the perpendicular magnetic recording head, and a trailing-side magnetic shield positioned on a trailing side of the main pole in the down-track direction adjacent the media-facing surface of the perpendicular magnetic recording head, wherein a trailing side taper is provided on the trailing side of the main pole in the down-track direction, wherein a leading shield taper is provided on a main pole side of the leading-side magnetic shield, and wherein an angle of the trailing side taper relative to a line extending along an element height direction is less than or equal to an angle of the leading shield taper relative to the line extending along the element height direction.

In another general embodiment, a method for forming a perpendicular magnetic recording head includes forming a leading-side magnetic shield, forming a leading shield taper on an upper side of the leading-side magnetic shield, forming a main pole above the leading-side magnetic shield, wherein the leading-side magnetic shield is positioned above a leading side of the main pole in a down-track direction adjacent a media-facing surface of the perpendicular magnetic recording head, forming a trailing side taper on a trailing side of the main pole in the down-track direction, and forming a trailing-side magnetic shield above a trailing side of the main pole in the down-track direction adjacent the media-facing surface of the perpendicular magnetic recording head, wherein an angle of the trailing side taper relative to a line extending along an element height direction is less than or equal to an angle of the leading shield taper relative to the line extending along the element height direction.

Referring now to FIG. 1, there is shown a disk drive 100 in accordance with one embodiment of the present invention. As shown in FIG. 1, at least one rotatable magnetic disk 112 is supported on a spindle 114 and rotated by a drive mechanism, which may include a disk drive motor 118. The magnetic recording on each disk is typically in the form of an annular pattern of concentric data tracks (not shown) on the disk 112.

At least one slider 113 is positioned near the disk 112, each slider 113 supporting one or more magnetic read/write heads 121. As the disk rotates, slider 113 is moved radially in and out over disk surface 122 so that heads 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by controller 129, such as access control signals and internal clock signals. Typically, control unit 129 comprises logic control circuits, storage (e.g., memory), and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the ABS 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the ABS 318. The ABS 318 is indicated across the right side of the structure.

Perpendicular writing is achieved by forcing flux through the stitch pole 308 into the main pole 306 and then to the surface of the disk positioned towards the ABS 318.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the ABS 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the ABS 418). The ABS 418 is indicated across the right side of the structure. The trailing shield 404 may be in contact with the main pole 406 in some embodiments.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater is shown near the non-ABS side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

In order to combat ATI and FTI in a magnetic recording head, the laminate of the magnetic body on a media-facing side of the main pole may be increased. Furthermore, a taper is provided on a trailing side and a leading side of a down-track direction of the main pole, and in particular a taper angle of the leading side where the geometric width is narrow may be about 30° or more and about 60° or less.

By making a length of the leading side taper in a specific range, for example, between about 300 nm and about 450 nm, a configuration is provided in which there is an area with a thick film (magnetic body) on the leading side of the main pole (a thickness of the main pole at the rear end portion may be longer, for example, about 500 nm). In addition, erroneous reading from adjacent or nearby tracks due to ATI or FTI, etc., is prevented using the above described structure.

The taper angle of the trailing side where the geometric width is wider may be less than the taper angle of the leading side taper. In other words, the taper angle may be set to about 5° or more and about 30° or less. In this structure magnetic flux on the trailing side is controlled, which prevents oversaturation of an adjacent shield.

Furthermore, a non-magnetic bump may be provided between the main pole and the shields, and a taper angle is formed on the shield side of the bump; in particular, by maintaining the taper angle of the trailing side, a linear rear surface is formed on the shield. Also, by making the taper length 350 nm or longer, for example, a structure is obtained in which even if the taper is set small, the distance between the main pole and the adjacent shield is 100 nm or more. As a result of this configuration, a perpendicular magnetic recording head according to one embodiment is provided with a trailing side taper angle that is less than a leading side taper angle.

Figure 5A:
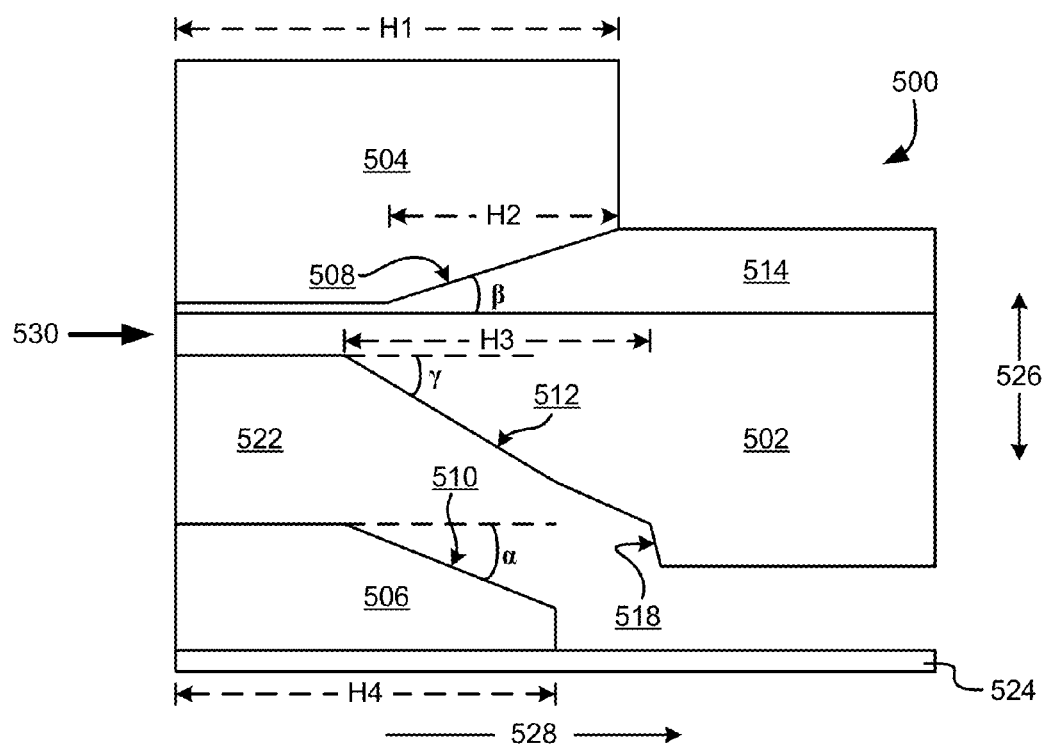
FIG. 5A shows a portion of a perpendicular magnetic recording head according to one embodiment.
Figure 5B:
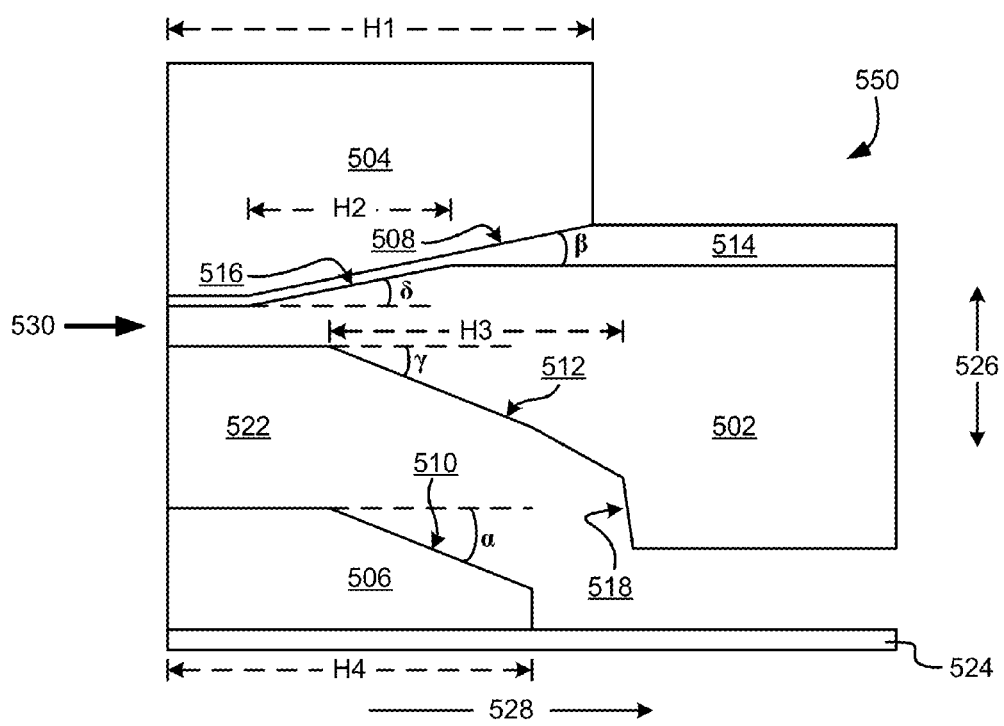
FIG. 5B shows a portion of a perpendicular magnetic recording head according to another embodiment.

Now referring to FIGS. 5A-5B, portions of two perpendicular magnetic recording heads 500, 550, respectively, are shown according to two embodiments. Each perpendicular magnetic recording head 500, 550 includes a main pole 502, a trailing-side magnetic shield 504 on a trailing side of the main pole 502, a leading-side magnetic shield 506 on a leading side of the main pole 502, and a non-magnetic insulating layer 522 positioned between the main pole 502 and the leading-side magnetic shield 506. Each of these layers has a portion thereof which is positioned adjacent a media-facing surface 530 of the perpendicular magnetic recording head 500, 550.

In some embodiments, a slider substrate 524 or some other substrate or base layer may be positioned below portions of the insulating layer 522 and the leading-side magnetic shield 506. For each perpendicular magnetic recording head 500, 550, a trailing side taper 508 is provided on the leading side of the trailing-side magnetic shield 504 in a down-track direction 526 relative to a trailing side of the main pole 502 and/or a trailing side of a non-magnetic bump 514, which begins at a position away from the media-facing surface 530 in the element height direction 528. Also, a leading shield taper 510 is provided on a main pole-facing side of the leading-side magnetic shield 506 in the down-track direction 526, which begins at a position away from the media-facing surface 530 in the element height direction 528. The position at which each taper 508, 510 begins may be the same in the element height direction 528 or different, according to various embodiments.

As shown in FIGS. 5A-5B, an asymmetric relationship may be satisfied where a trailing side taper angle β of the trailing side taper 508, which may be an angle of taper for the trailing-side magnetic shield 504, the non-magnetic bump 514, and/or the trailing side of the main pole 502 (as shown in FIG. 5B), is less than or equal to a leading shield taper angle α of the leading shield taper 510.

Due to the structures of each perpendicular magnetic recording head 500, 550 it is possible to increase a thickness of the magnetic body that forms the main pole 502 adjacent the media-facing side of the main pole 502, and to prevent erroneous reading of adjacent or nearby tracks due to ATI, FTI, etc.

Figure 8:
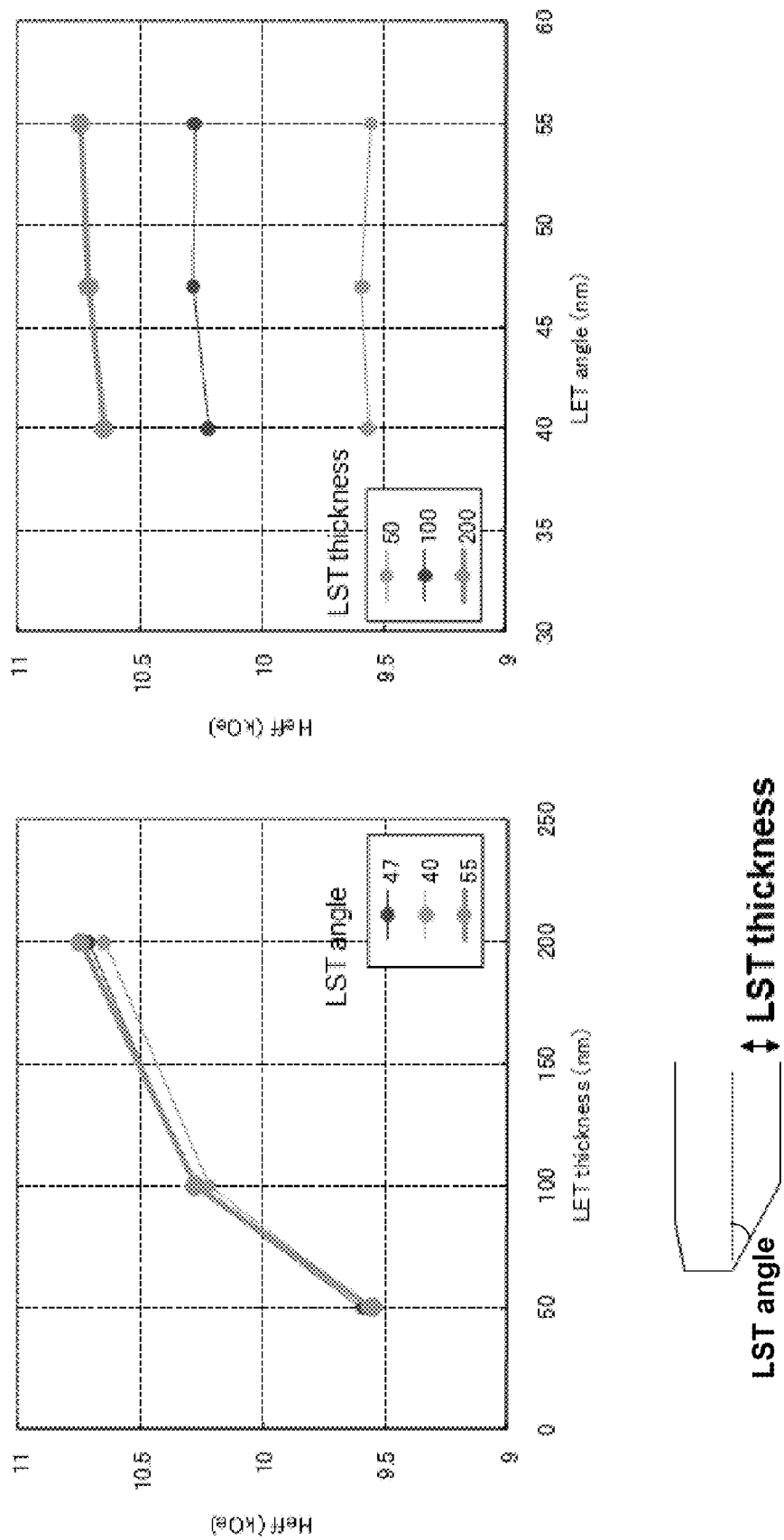
FIG. 8 shows results of testing on a manufactured perpendicular magnetic recording head according to one embodiment.

Referring again to FIGS. 5A-5B, in another embodiment, a leading pole taper 512 may be provided on the leading side of the main pole 502 in the down-track direction 526. The leading pole taper 512 has a leading pole taper angle γ that may be more than, equal to, or less than the leading shield taper angle α. In one embodiment, the leading shield taper angle α and/or the leading pole taper angle γ may be in a range between about 30° and about 60°. As shown in FIG. 8, some experiments were carried out on this arrangement, and the results are shown.

As shown in FIG. 5B, a constant leading shield taper angle α may be used that is equal to the leading pole taper angle γ such that the distance between the leading-side magnetic shield 506 and the main pole 502 may be maintained as a constant, in one embodiment. In other embodiments, the leading shield taper angle α may change along a line extending along the element height direction 528 perpendicular to the media-facing surface 530 of the perpendicular magnetic recording head 500, which would result in a non-constant distance between the leading-side magnetic shield 506 and the main pole 502 in the down-track direction.

According to another embodiment, as shown in FIG. 5B, the main pole 502 may have a trailing pole taper 516 on a trailing side of the main pole 502 in the down-track direction 526. The trailing pole taper 516 may have a trailing pole taper angle α that is in a range between about 5° and about 30°. This is in order to ensure that the thickness of the main pole 502 at a position beyond the tapering in the element height direction 528 is sufficiently thick in the down-track direction 526, as would be understood by one of skill in the art, to provide a sufficiently strong magnetic field when energized. This results in a high magnetic field being obtained due to the increase in the leading pole taper angle γ. With this structure, magnetic flux is controlled on the trailing side of the main pole 502, which has the effect of preventing oversaturation of the adjacent trailing-side magnetic shield 504.

According to another embodiment, as shown in FIG. 5B, the main pole 502 may have a trailing pole taper 516 on a trailing side of the main pole 502 in the down-track direction 526. The trailing pole taper 516 may have a trailing pole taper angle δ that is in a range between about 5° and about 30°. In one embodiment, the trailing pole taper angle δ may be about equal to the trailing side taper angle β.

Figure 9:
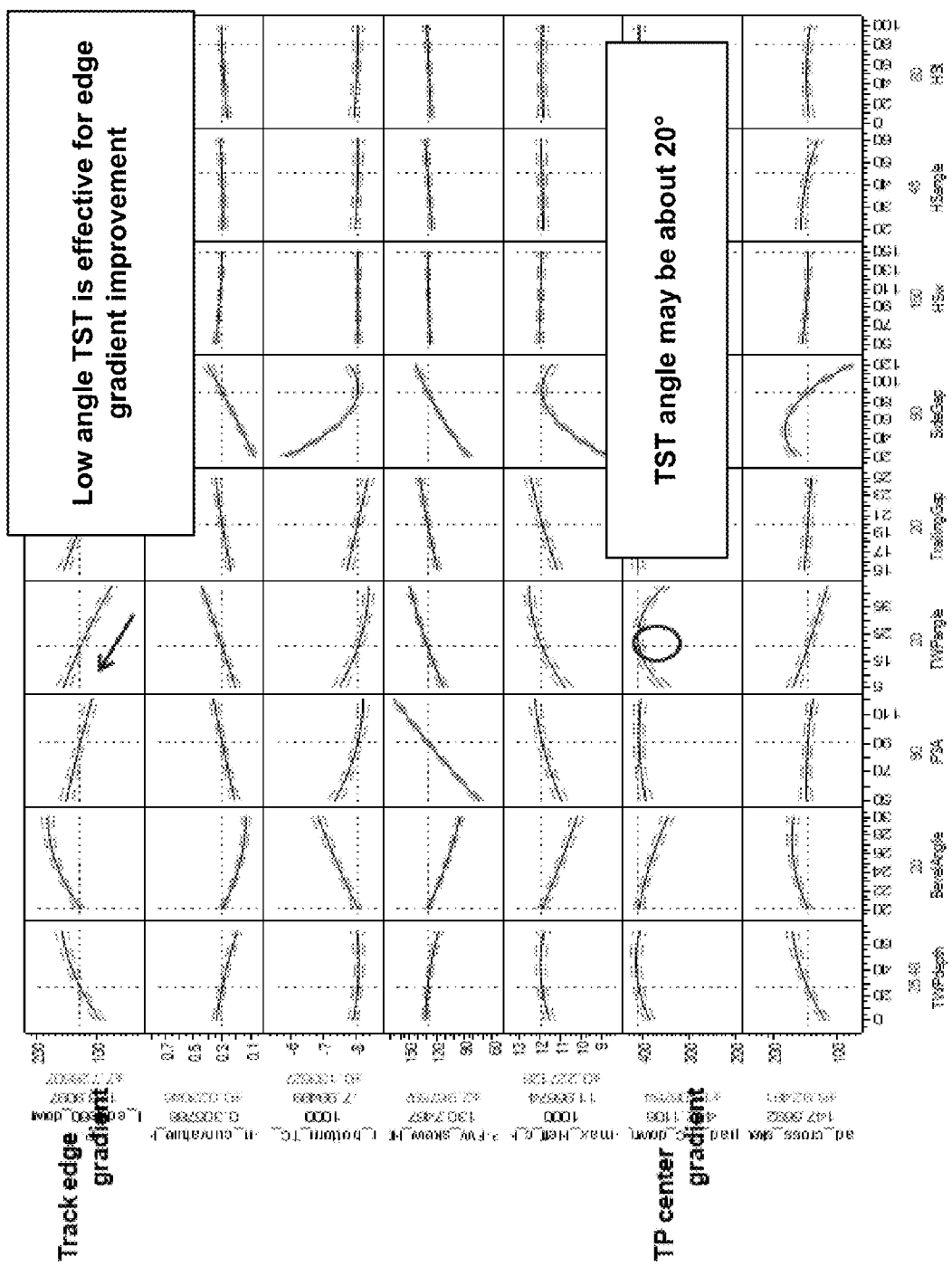
FIG. 9 shows results of testing on a manufactured perpendicular magnetic recording head according to one embodiment.

In another embodiment, the trailing side taper angle β may be in a range from about 5° to about 30°. As shown in FIG. 9, performance of the perpendicular magnetic recording head is greatest when the trailing side taper angle is about 20°, but any value between about 5° and about 30° also produce great performance. Referring again to FIGS. 5A-5B, having the trailing side taper angle β in this range results in an improved slope of the track edge when the low angle trailing side taper angle β has sufficient strength with respect to the medium.

For shingled magnetic recording (SMR) where width of the main pole 502 is typically wider than in conventional recording and may have a wide side gap and low bevel angle (about 20° or less), a trailing side taper angle β of about 15° or more and about 20° or less may be used, in one approach.

In another approach, each perpendicular magnetic recording head 500, 550 may include a non-magnetic bump 514 that is positioned between a trailing side of the main pole 502 and the leading side of the trailing-side magnetic shield 504. Any suitable material known in the art may be used for the non-magnetic bump 514, such as alumina ($Al_2O_3$), MgO, etc. In this approach, the non-magnetic bump 514 may be positioned along all (as shown in FIG. 5A) or only a part (as shown in FIG. 5B) of the trailing side taper 508. In particular, by using a non-magnetic bump 514 that is positioned along all of the trailing side taper 508, a linear rear surface of the main pole 502 is possible, which reduces complexity in manufacturing.

In another embodiment, a height H3 in the element height direction 528 of the leading pole taper 512 of the main pole 502 may be determined by a height H4 in the element height direction of the leading-side magnetic shield 506, such that the overall height H3 of the leading pole taper 512 is less than or equal to an overall height H4 (from the media-facing surface 530) of the leading-side magnetic shield 506. This structure results in a region with a thick film (magnetic body) on the leading side of the main pole 502 (with a thickness of the main pole 502 at a position beyond the tapering being between about 250 nm and about 1000 nm, such as about 500 nm).

In another approach, a height H3 in the element height direction 528 of the leading pole taper 512 from the media-facing surface 530 may be greater than or equal to a height H4 in the element height direction of the leading-side magnetic shield 506 from the media-facing surface 530.

In one approach, a height H2 of the trailing pole taper 516 in the element height direction 528 may be less than or equal to a height H1 of the trailing-side magnetic shield 504 in the element height direction 528. In this approach, even when a gentle taper is used, the distance between the main pole 502 and the trailing-side magnetic shield 504 may be 100 nm or more, as shown in FIG. 5B.

Referring again to FIGS. 5A-5B, according to another embodiment, a step 518 may be provided on the leading side of the main pole 502 at the end of the leading pole taper 512 in the element height direction 528, the step increasing the thickness of the main pole 502 in the down-track direction 526. As a result of this step 518, the main pole 502 at a position beyond the tapering may be substantially thicker than the main pole 502 adjacent the media-facing surface 530 of the perpendicular magnetic recording head 500, 550.

Figure 7:
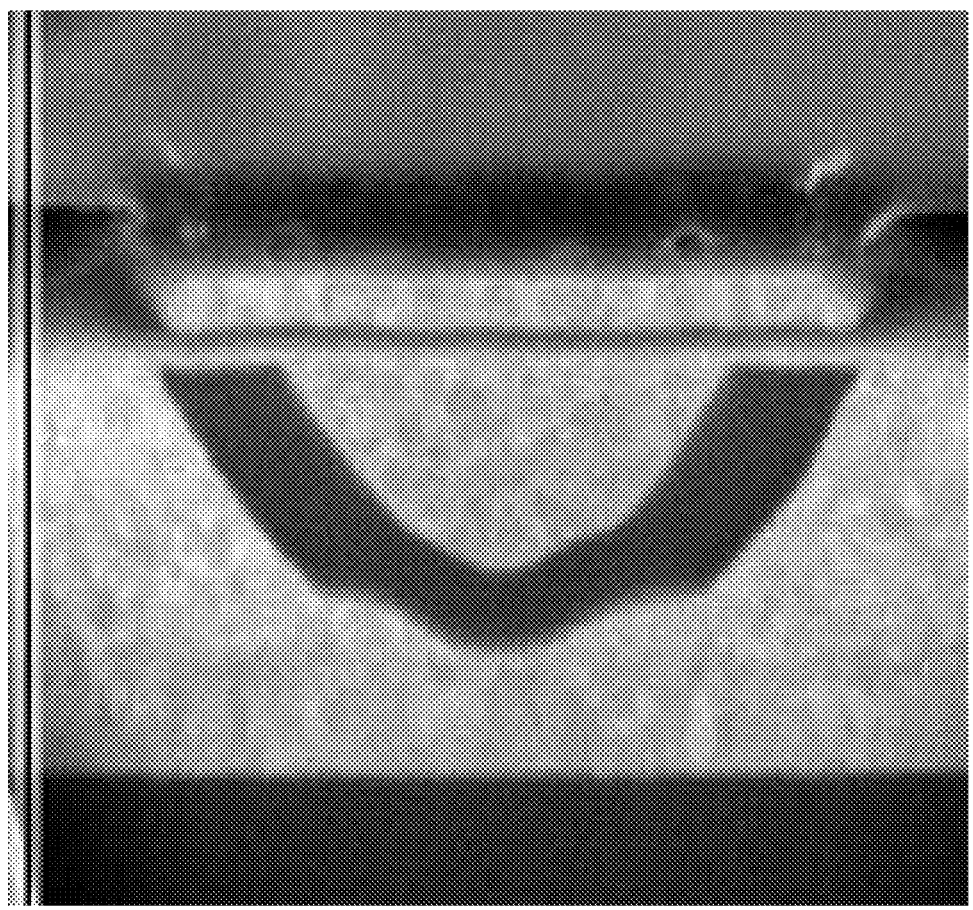
FIG. 7 shows an image of a manufactured perpendicular magnetic recording head according to one embodiment.

In a further embodiment, the step 518, which is located on the leading side of the main pole 502 at the end of the leading pole taper 512 in the element height direction 528, may be provided with a concave shape when viewed from the media-facing side. This concave shape may appear as shown in FIG. 7 in one embodiment.

Figure 6:
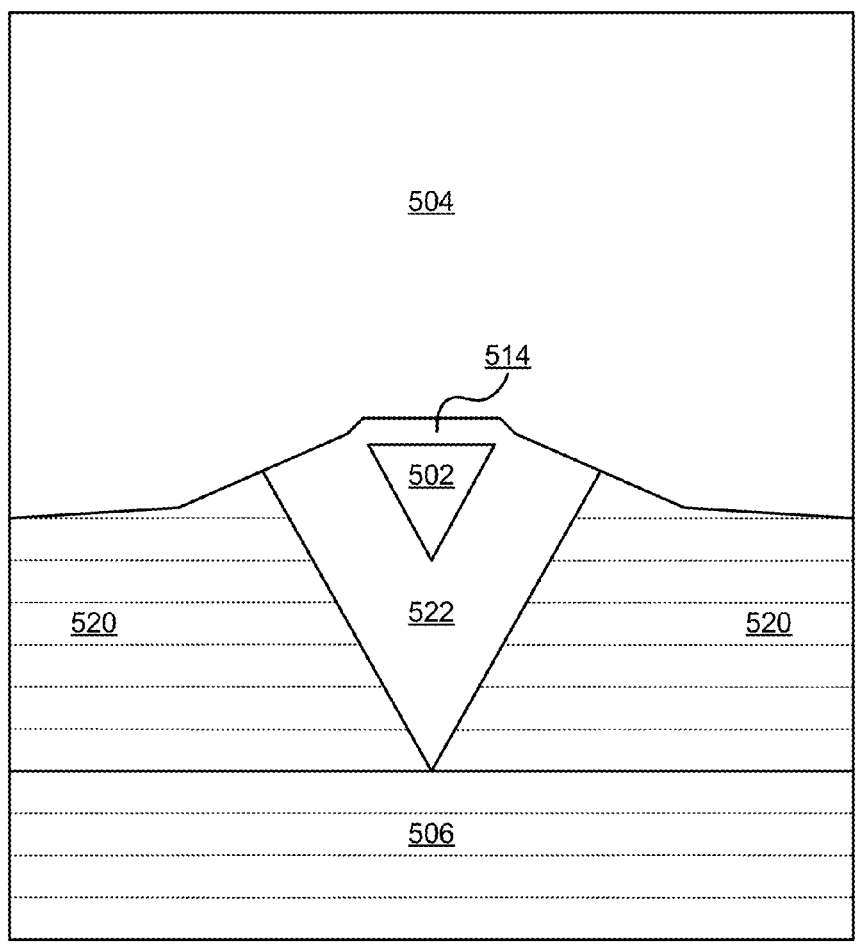
FIG. 6 shows a media-facing surface view of a portion of a perpendicular magnetic recording head according to one embodiment.

In another embodiment, as shown in FIG. 6, a side magnetic shield 520 may be provided on both sides of the main pole 502 in a cross-track direction. In this embodiment, the side magnetic shield 520 and/or the leading-side magnetic shield 506 may have a multi-layered structure, as indicated by the striation lines running through the layers. In a further embodiment, the leading-side magnetic shield 506 may comprise an antiferromagnetic coupling multi-layered film, which has an effect of reducing FTI further.

A method for forming a perpendicular magnetic head is now described according to one embodiment. The method may be performed in any desired environment, including those described herein and others.

In this method, the leading-side magnetic shield is formed, which may act as a base for the formation of other layers thereon, such as in pattern plating or the like (in pattern plating, the desired pattern is formed using a resist or the like, and a plating film is formed within the pattern). The leading-side magnetic shield may be formed above a substrate in one approach. The leading-side magnetic shield may comprise NiFe, CoFe, or some other suitable material known in the art.

Next, the substrate is removed by Ar ion milling, and an alumina film, or the like, is formed by sputtering, or the like, for planarization of the leading-side magnetic shield. Then, planarization is carried out by chemical mechanical polishing (CMP) or the like. Next, a hard mask is formed thereon using any suitable material, for example NiCr/Ta, by sputtering or the like.

After the hard mask is formed, the resist is coated and the shape of the main pole is patterned therein. After patterning, a groove shape is formed in the shield film and the alumina film by Ar ion milling, RIE, etc. At this time the leading-side magnetic shield has a taper due to the difference in area of the aperture and the difference in etching rate, thus causing an angle to be formed.

Next, a non-magnetic film, such as alumina, is formed to a desired film thickness as a side gap, wherein a thickness of the non-magnetic film determines the thickness of the side gap. After forming a plating underlayer, a resist is patterned thereon, and the main pole is plated using the resist pattern.

After removing the resist, planarization is carried out, such as via CMP, to adjust a thickness of the main pole. Then, another non-magnetic film is formed over the whole surface, such as by sputtering, a resist pattern is placed in desired positions to form a desired pattern, Ar ion milling of the non-magnetic film and the main pole is carried out, and a slope is formed on an upper surface of the main pole. Then, after forming a magnetic gap film, a substrate film is sputtered, and a soft magnetic film is formed on the trailing side of the main pole to form the trailing-side magnetic shield.

Any of the various layers and films described above may have any suitable material utilized according to their individual functions and/or purposes, as would be known to one of skill in the art.

Figure 10:
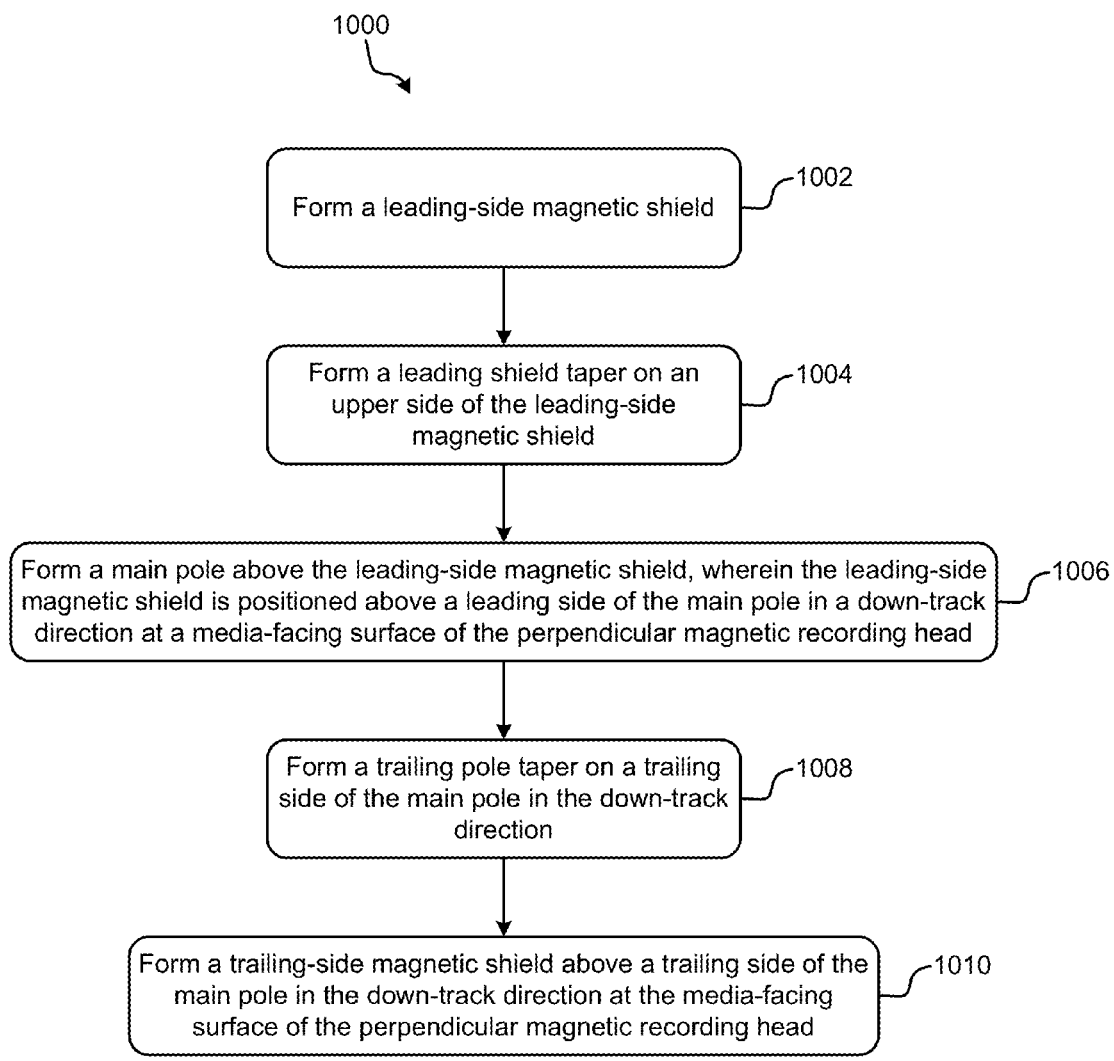
FIG. 10 shows a flowchart of a method according to one embodiment.

Now referring to FIG. 10, a method 1000 for forming a perpendicular magnetic recording head is shown according to one embodiment. Method 1000 may be performed in accordance with the present invention in any of the environments depicted in FIGS. 1-9, among others, in various embodiments. Of course, more or less operations than those specifically described in FIG. 10 may be included in method 1000, as would be understood by one of skill in the art upon reading the present descriptions.

Each of the steps of the method 1000 may be performed by any suitable component of the operating environment. As shown in FIG. 10, method 1000 may initiate with operation 1002, where a leading-side magnetic shield is formed of any suitable material known in the art. In operation 1004, a leading shield taper is formed on an upper side of the leading-side magnetic shield, the side which will eventually face the main pole.

In operation 1006, a main pole is formed above the leading-side magnetic shield. The leading-side magnetic shield is positioned above a leading side of the main pole in a down-track direction adjacent a media-facing surface of the perpendicular magnetic recording head. Any suitable formation technique and material may be used for the main pole as would be known to one of skill in the art.

In operation 1008, a trailing side taper is formed on a trailing side of the main pole in the down-track direction.

In operation 1010, a trailing-side magnetic shield is formed above a trailing side of the main pole in the down-track direction adjacent the media-facing surface of the perpendicular magnetic recording head. The trailing pole taper is less than or equal to the leading shield taper.

In another embodiment, a leading pole taper may be formed on a leading side of the main pole. A leading pole taper angle of the leading pole taper relative to an element height direction may be constant, with the leading pole taper angle being in a range between about 30° and about 60°.

According to another embodiment, a height in an element height direction of the leading pole taper from the media-facing surface of the perpendicular magnetic recording head may be greater than or equal to a height in the element height direction of the leading-side magnetic shield from the media-facing surface of the perpendicular magnetic recording head.

Also, in some approaches, a trailing side taper angle of the trailing side taper relative to an element height direction may be in a range between about 5° and about 30°.

In another embodiment, method 1000 may further include forming a non-magnetic bump between the trailing side of the main pole and a leading side of the trailing shield at a position away from the media-facing surface of the perpendicular magnetic recording head. In this embodiment, some or all of the trailing side taper is provided by the non-magnetic bump.

According to another embodiment, a height in an element height direction of the trailing side taper may be less than or equal to a height of the trailing-side magnetic shield in the element height direction from the media-facing surface of the perpendicular magnetic recording head.

In another embodiment, a step may be formed on the leading side of the main pole at an end of the leading pole taper in an element height direction. The step increases a thickness of the magnetic pole in the down-track direction.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A perpendicular magnetic recording head, comprising:
   a main pole configured to write data to a magnetic medium, wherein a leading pole taper is provided on a leading side of the main pole;
   a leading-side magnetic shield positioned on a leading side of the main pole in a down-track direction adjacent a media-facing surface of the perpendicular magnetic recording head; and
   a trailing-side magnetic shield positioned on a trailing side of the main pole in the down-track direction adjacent the media-facing surface of the perpendicular magnetic recording head,
   wherein a trailing side taper is provided on the trailing side of the main pole in the down-track direction,
   wherein a leading shield taper is provided on a main pole side of the leading-side magnetic shield, and
   wherein an angle of the trailing side taper relative to a line extending along an element height direction is less than or equal to an angle of the leading shield taper relative to the line extending along the element height direction,
   wherein a step is provided on the leading side of the main pole at an end of the leading pole taper in the element height direction, the step increasing a thickness of the main pole in the down-track direction.

2. The perpendicular magnetic recording head as recited in claim 1, further comprising a non-magnetic bump positioned between the trailing side of the main pole and a leading side of the trailing-side magnetic shield at a position away from the media-facing surface of the perpendicular magnetic recording head.

3. The perpendicular magnetic recording head as recited in claim 1, wherein a leading pole taper angle of the leading pole taper relative to the line extending along the element height direction is constant.

4. The perpendicular magnetic recording head as recited in claim 3, wherein the leading pole taper angle is in a range between about 30° and about 60°.

5. The perpendicular magnetic recording head as recited in claim 1, wherein a height in the element height direction of the leading pole taper from the media-facing surface of the perpendicular magnetic recording head is greater than or equal to a height in the element height direction of the leading-side magnetic shield from the media-facing surface of the perpendicular magnetic recording head.

6. The perpendicular magnetic recording head as recited in claim 2, wherein some or all of the trailing side taper is provided by the non-magnetic bump.

7. The perpendicular magnetic recording head as recited in claim 1, wherein the step has a concave cross-sectional shape when viewed from the media-facing surface of the perpendicular magnetic recording head.

8. The perpendicular magnetic recording head as recited in claim 1, wherein a trailing side taper angle of the trailing side taper relative to the line extending along the element height direction is in a range between about 5° and about 30°.

9. The perpendicular magnetic recording head as recited in claim 1, wherein a height in the element height direction of the trailing side taper is less than or equal to a height of the trailing-side magnetic shield in the element height direction from the media-facing surface of the perpendicular magnetic recording head.

10. The perpendicular magnetic recording head as recited in claim 1, further comprising a side magnetic shield positioned on both sides of the main pole in a cross-track direction, wherein at least one of the side magnetic shield and the leading-side magnetic shield comprises a multi-layered structure.

11. A magnetic data storage system, comprising:
    at least one perpendicular magnetic recording head as recited in claim 1;
    a magnetic medium;
    a drive mechanism for passing the magnetic medium over the at least one perpendicular magnetic recording head; and
    a controller electrically coupled to the at least one perpendicular magnetic recording head for controlling operation of the at least one perpendicular magnetic recording head.

12. A method for forming a perpendicular magnetic recording head, the method comprising:
    forming a leading-side magnetic shield;
    forming a leading shield taper on an upper side of the leading-side magnetic shield, the leading shield taper being located at a position along the upper side of the leading-side magnetic shield away from a media-facing surface of the perpendicular magnetic recording head in an element height direction such that the leading shield is not tapered at the media-facing surface of the perpendicular magnetic recording head;
    forming a main pole above the leading-side magnetic shield, wherein the leading-side magnetic shield is positioned below a leading side of the main pole in a down-track direction adjacent the media-facing surface of the perpendicular magnetic recording head;
    forming a trailing side taper on a trailing side of the main pole in the down-track direction; and
    forming a trailing-side magnetic shield above a trailing side of the main pole in the down-track direction adjacent the media-facing surface of the perpendicular magnetic recording head, wherein an angle of the trailing side taper relative to a line extending along the element height direction is less than or equal to an angle of the leading shield taper relative to the line extending along the element height direction.

13. The method as recited in claim 12, further comprising forming a leading pole taper on a leading side of the main pole, wherein a leading pole taper angle of the leading pole taper relative to the line extending along the element height direction is constant, and wherein the leading pole taper angle is in a range between about 30° and about 60°.

14. The method as recited in claim 13, wherein a height in the element height direction of the leading pole taper from the media-facing surface of the perpendicular magnetic recording head is greater than or equal to a height in the element height direction of the leading-side magnetic shield from the media-facing surface of the perpendicular magnetic recording head.

15. The method as recited in claim 13, further comprising forming a step on the leading side of the main pole at an end of the leading pole taper in the element height direction, the step increasing a thickness of the main pole in the down-track direction.

16. The method as recited in claim 12, wherein a trailing side taper angle of the trailing side taper relative to the line extending along the element height direction is in a range between about 5° and about 30°.

17. The method as recited in claim 16, further comprising forming a non-magnetic bump between the trailing side of the main pole and a leading side of the trailing shield at a position away from the media-facing surface of the perpendicular magnetic recording head, wherein some or all of the trailing side taper is provided by the non-magnetic bump.

18. The method as recited in claim 12, wherein a height in the element height direction of the trailing side taper is less than or equal to a height of the trailing-side magnetic shield in the element height direction from the media-facing surface of the perpendicular magnetic recording head.

19. A perpendicular magnetic recording head, comprising:
   a main pole configured to write data to a magnetic medium;
   a leading-side magnetic shield positioned on a leading side of the main pole in a down-track direction adjacent a media-facing surface of the perpendicular magnetic recording head;
   a trailing-side magnetic shield positioned on a trailing side of the main pole in the down-track direction adjacent the media-facing surface of the perpendicular magnetic recording head; and
   a non-magnetic bump positioned between the trailing side of the main pole and a leading side of the trailing-side magnetic shield at a position away from the media-facing surface of the perpendicular magnetic recording head,
   wherein a trailing side taper is provided on the trailing side of the main pole in the down-track direction,
   wherein a leading pole taper is provided on a leading side of the main pole,
   wherein a leading shield taper is provided on a main pole side of the leading-side magnetic shield, and
   wherein an angle of the trailing side taper relative to a line extending along an element height direction is less than or equal to an angle of the leading shield taper relative to the line extending along the element height direction.

20. The perpendicular magnetic recording head as recited in claim 19, wherein some or all of the trailing side taper is provided by the non-magnetic bump.

\* \* \* \* \*